United States Patent
Adachi

(10) Patent No.: US 12,082,336 B2
(45) Date of Patent: Sep. 3, 2024

(54) DIFFERENTIAL CIRCUIT BOARD AND SEMICONDUCTOR LIGHT EMITTING DEVICE

(71) Applicant: Lumentum Japan, Inc., Sagamihara (JP)

(72) Inventor: Koichiro Adachi, Tokyo (JP)

(73) Assignee: Lumentum Japan, Inc., Kanagawa (JP)

( * ) Notice: Subject to any disclaimer, the term of this patent is extended or adjusted under 35 U.S.C. 154(b) by 729 days.

(21) Appl. No.: 17/216,118

(22) Filed: Mar. 29, 2021

(65) Prior Publication Data

US 2022/0087007 A1    Mar. 17, 2022

(30) Foreign Application Priority Data

Sep. 14, 2020  (JP) .................................. 2020-153685
Nov. 10, 2020  (JP) .................................. 2020-186989

(51) Int. Cl.
*H05K 1/02*     (2006.01)
*H01P 3/08*     (2006.01)

(52) U.S. Cl.
CPC ............. *H05K 1/024* (2013.01); *H01P 3/081* (2013.01); *H05K 1/0219* (2013.01);
(Continued)

(58) Field of Classification Search
CPC .... H05K 1/024; H05K 1/0219; H05K 1/0245; H05K 2201/0191; H05K 2201/09236;
(Continued)

(56) References Cited

U.S. PATENT DOCUMENTS

| 4,956,697 A | 9/1990 | Kobiki et al. |
| 5,652,557 A * | 7/1997 | Ishikawa .................. H01P 3/081  333/246 |

(Continued)

FOREIGN PATENT DOCUMENTS

| CN | 102378488 A | 3/2012 |
| JP | H01257355 A | 10/1989 |

(Continued)

OTHER PUBLICATIONS

H.R. Kaupp, "Characteristics of Microstrip Transmission Lines", IEEE Transactions on Electronic Computers, Apr. 1967, 9 pages, vol. EC-16, Issue No. 2.

*Primary Examiner* — Hoa C Nguyen
(74) *Attorney, Agent, or Firm* — Harrity & Harrity, LLP

(57) ABSTRACT

A differential circuit board includes a dielectric layer having a first and a second surface, a first conductor line with a first line-width, a second conductor line with a second line-width less than the first line-width, and a ground conductor. The dielectric layer has a first portion with a first thickness between the first and second surface and a second portion with a second thickness less than the first thickness between the first and second surfaces. The first conductor line is disposed on the first surface of the first portion. The second conductor line is disposed on the first surface of the second portion. The ground conductor is disposed on the second surface of the first portion and the second surface of the second portion, wherein the ground conductor overlaps with the first conductor line and the second conductor line. The first and second conductor lines are differential transmission lines.

20 Claims, 21 Drawing Sheets

(52) U.S. Cl.
CPC ... *H05K 1/0245* (2013.01); *H05K 2201/0191* (2013.01); *H05K 2201/09236* (2013.01); *H05K 2201/097* (2013.01); *H05K 2201/09727* (2013.01)

(58) Field of Classification Search
CPC ...... H05K 2201/097; H05K 2201/0927; H01P 3/081
See application file for complete search history.

(56) References Cited

U.S. PATENT DOCUMENTS

| | | | |
|---|---|---|---|
| 7,397,974 B2 | 7/2008 | Ichikawa et al. | |
| 10,849,220 B1* | 11/2020 | Phan | H05K 1/0253 |
| 10,866,439 B2 | 12/2020 | Kanazawa et al. | |
| 10,903,543 B2* | 1/2021 | Becker | H05K 1/0219 |
| 2006/0028305 A1* | 2/2006 | Dutta | H05K 1/024 |
| | | | 333/238 |
| 2007/0194434 A1* | 8/2007 | Lin | H05K 1/0253 |
| | | | 257/700 |
| 2008/0023804 A1* | 1/2008 | Dutta | H01L 23/66 |
| | | | 257/664 |
| 2008/0073747 A1 | 3/2008 | Chao et al. | |
| 2011/0019371 A1* | 1/2011 | Hsu | H05K 1/0245 |
| | | | 361/749 |
| 2014/0010495 A1 | 1/2014 | Hill et al. | |
| 2015/0173256 A1* | 6/2015 | Ao | H05K 1/0245 |
| | | | 174/250 |
| 2016/0174361 A1* | 6/2016 | Chen | H01P 3/026 |
| | | | 333/1 |
| 2016/0174374 A1* | 6/2016 | Kong | H01L 24/10 |
| | | | 29/829 |
| 2017/0156203 A1* | 6/2017 | Shiue | H05K 1/0219 |
| 2019/0044301 A1 | 2/2019 | Adachi | |
| 2019/0069391 A1* | 2/2019 | Sutono | H01L 23/5386 |
| 2020/0395318 A1* | 12/2020 | Kuan | H01L 23/50 |

FOREIGN PATENT DOCUMENTS

| | | |
|---|---|---|
| JP | H09223851 A | 8/1997 |
| JP | 2002100842 A | 4/2002 |
| JP | 2003043437 A | 2/2003 |
| JP | 2004140134 A | 5/2004 |
| JP | 2019029649 A | 2/2019 |
| WO | 2016152152 A1 | 9/2016 |

* cited by examiner

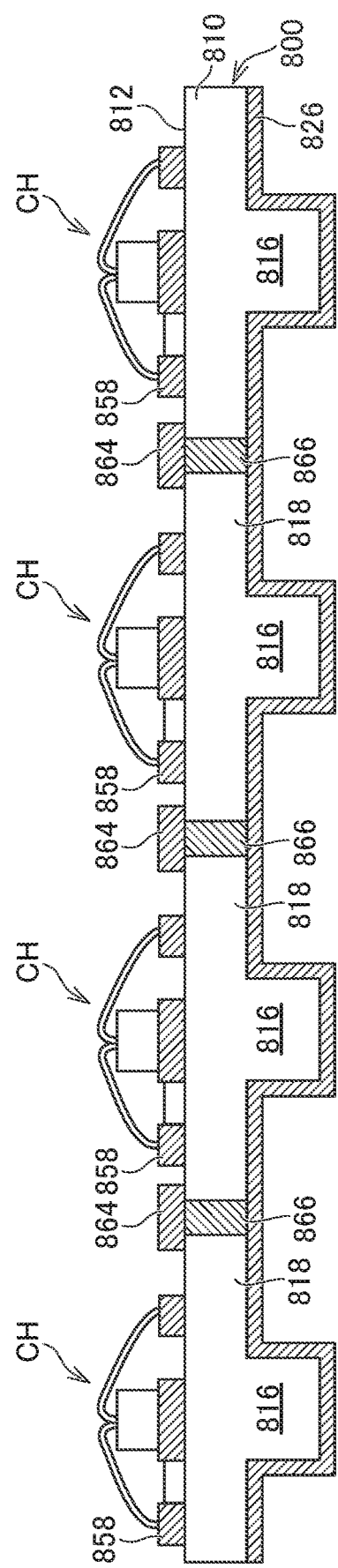

DIFFERENTIAL CIRCUIT BOARD AND SEMICONDUCTOR LIGHT EMITTING DEVICE

CROSS-REFERENCE TO RELATED APPLICATION

The present application claims priority from Japanese patent applications JP2020-153685 filed on Sep. 14, 2020 and JP2020-186989 filed on Nov. 10, 2020, the contents of which are hereby expressly incorporated by reference herein.

TECHNICAL FIELD

The disclosure relates to a differential circuit board and a semiconductor light-emitting device.

BACKGROUND

A differential drive system is known for ensuring quality of electrical signals of a communication optical module, such as an electro-absorption modulator integrated laser (EML). A differential drive system has a pair of differential transmission lines in a same line-width to balance a pair of signals with inverted phases. In some cases, the line-width needs to be wide enough to mount the EML on one of the pair of differential transmission lines. In such cases, it is difficult to downsize the differential drive system as compared to a single-ended drive system.

SUMMARY

According to some possible implementations, a differential circuit board may include: a dielectric layer having a first surface and a second surface, the dielectric layer having a first portion with a first thickness between the first surface and the second surface, the dielectric layer having a second portion with a second thickness less than the first thickness between the first surface and the second surface; a first conductor line with a first line-width, the first conductor line disposed on the first surface of the first portion; a second conductor line with a second line-width less than the first line-width, the second conductor line disposed on the first surface of the second portion; and a ground conductor disposed on the second surface of the first portion and the second surface of the second portion, the ground conductor overlapping with the first conductor line and the second conductor line. The first conductor line and the second conductor line may be differential transmission lines.

According to some possible implementations, a semiconductor light-emitting device may include: the differential circuit board; and an optical semiconductor device mounted on the differential circuit board.

BRIEF DESCRIPTION OF THE DRAWINGS

FIG. 21 is a cross-sectional view of an example semiconductor light-emitting device described herein.

DETAILED DESCRIPTION

Figure 1:
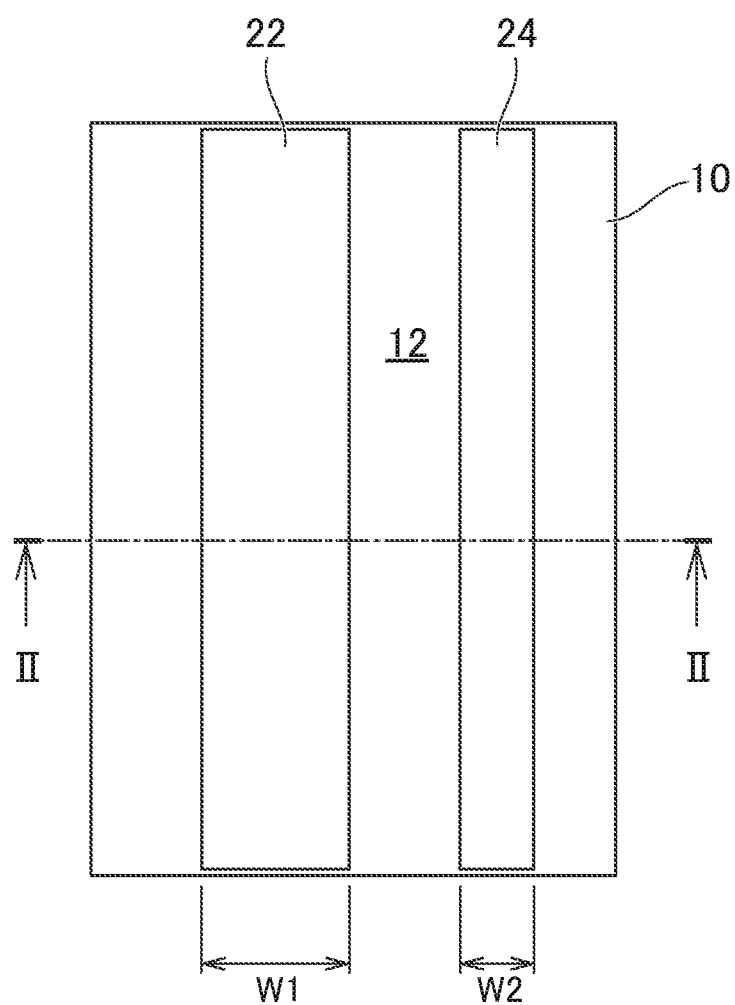
FIG. 1 is a plan view of an example differential circuit board described herein.

Hereinafter, some implementations will be described specifically and in detail with reference to drawings. In all the drawings, the members with the same reference numerals have the identical or same feature and their repetitive description will be omitted. Sizes of figures do not always comply with magnification.

Figure 2:
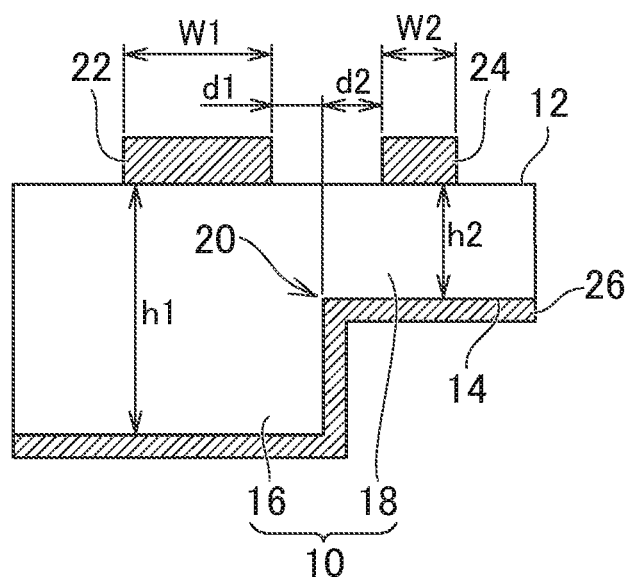
FIG. 2 is a II-II cross-sectional view of the example differential circuit board shown in FIG. 1.

FIG. 1 is a plan view of an example differential circuit board. FIG. 2 is a II-II cross-sectional view of the example differential circuit board shown in FIG. 1. The differential circuit board has a dielectric layer 10. The dielectric layer 10 comprises a dielectric, such as an aluminum nitride. The dielectric layer 10 is a single layer. The dielectric layer 10 has a first surface 12 and a second surface 14. The dielectric layer 10 includes a first portion 16. The first portion 16 has a first thickness h1 between the first surface 12 and the second surface 14. The dielectric layer 10 includes a second portion 18. The second portion 18 has a second thickness h2, which is less than the first thickness h1, between the first surface 12 and the second surface 14. The first portion 16 and the second portion 18 are flush on the first surface 12. The second surface 14 has a step (height converting unit) 20 between the first portion 16 and the second portion 18. That is, the difference in thickness between the first portion 16 and the second portion 18 appears on the second surface 14.

The example differential circuit board has a first conductor line 22. The first conductor line 22 has a first line-width W1. The first conductor line 22 is disposed on the first surface 12 of the first portion 16. The differential circuit board has a second conductor line 24. The second conductor line 24 has a second line-width W2, which is less than the first line-width W1. The second conductor line 24 is disposed on the first surface 12 of the second portion 18. The second conductor line 24 is located at the center of the second portion 18 in an alignment direction of the first conductor line 22 and the second conductor line 24. The step 20 of the second surface 14 is just below the center of a space between the first conductor line 22 and the second conductor line 24. That is, a distance d1 from the first conductor line 22 to the center is equal to a distance d2 from the second conductor line 24 to the center.

The first conductor line 22 and the second conductor line 24 comprise a material such as gold, and a laminated material may be used. The first conductor line 22 and the second conductor line 24 constitute differential transmission lines. The first line-width W1, the second line-width W2, the first thickness h1, and the second thickness h2 are designed to have the characteristic impedance of the differential transmission lines 100Ω.

The example differential circuit board has a ground conductor 26. The ground conductor 26 comprises a material such as gold, and a laminated material may be used. The ground conductor 26 is disposed on the second surface 14 of the first portion 16 and the second surface 14 of the second portion 18. The ground conductor 26 is continuous on the second surface 14 of the first portion 16 and on the second surface 14 of the second portion 18. The ground conductor 26 is also formed on a side surface, adjacent to the second portion 18, of the first portion 16. The ground conductor 26 is integrally formed, and therefore eliminates patterning and simplifies manufacturing processes associated with the example differential circuit board.

The ground conductor 26 overlaps with the first conductor line 22 and the second conductor line 24. Thus, the first conductor line 22 and the ground conductor 26 constitute a high-frequency line with GND in a microstrip line type. Further, the second conductor line 24 and the ground conductor 26 also constitute a high-frequency line with GND in a microstrip line type.

In this way, when the second line-width W2 is less than the first line-width W1, the example differential circuit board may be downsized (e.g., as compared to a conventional differential circuit board). Although the second line-width W2 is less than the first line-width W1, the second thickness h2 is less than the first thickness h1, thereby balancing the pair of signals to be differentially transmitted and leading to no deterioration of the characteristic impedance.

Figure 3:
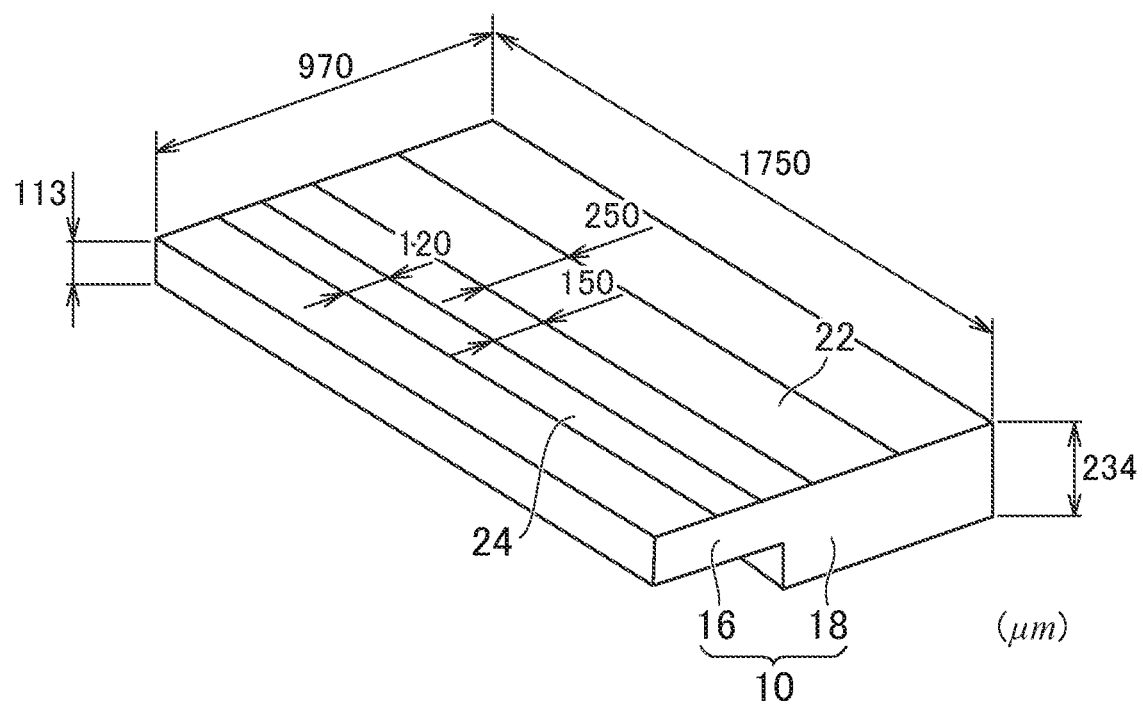
FIG. 3 is a diagram of a simulation model of an example differential circuit board described herein.

FIG. 3 is a diagram of a simulation model of an example differential circuit board. The first conductor line 22, the second conductor line 24, the first portion 16, and the second portion 18 have the features described above in relation to FIGS. 1 and 2. Specific dimensions are as shown. The differential impedance is set at 100Ω.

Figure 4:
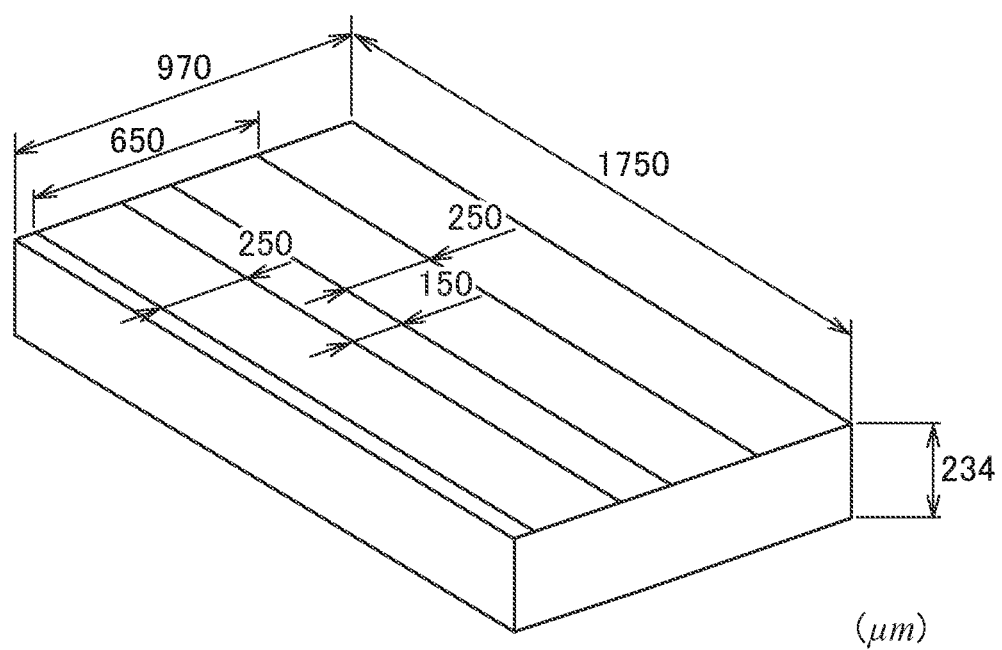
FIG. 4 is a diagram of a simulation model of an example differential circuit board described herein.

FIG. 4 is a diagram of a simulation model of an example differential circuit board. The widths of the pair of conductor lines are the same as shown in FIG. 3, and also the thickness of the dielectric layer is uniform. Specific dimensions are as shown. The differential impedance is set at 100Ω.

Figure 5:
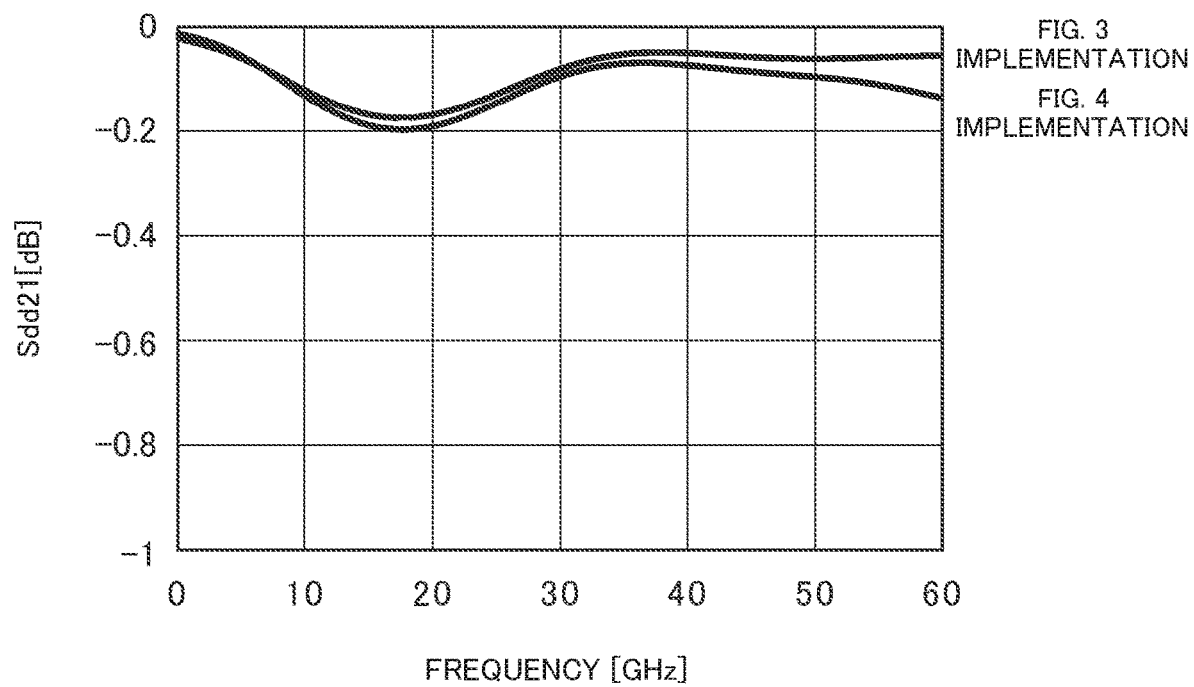
FIG. 5 is a diagram of frequency characteristics, related to example differential circuit boards described herein, obtained by simulation using a three-dimensional electric field analysis tool.

FIG. 5 is a diagram of frequency characteristics, related to the example differential circuit board shown in FIG. 3 and the example differential circuit board shown in FIG. 4, obtained by simulation using a three-dimensional electric field analysis tool. As shown in FIG. 5, sufficient transmission characteristics (S21) are obtained in the range of 0 GHz to 60 GHz for the FIG. 3 example differential circuit board and the FIG. 4 example differential circuit board. The FIG. 3 implementation of the example differential circuit board can obtain characteristics as good as a general differential circuit board, in applications up to at least 50 GHz, with the example differential circuit board smaller in size by 20%. The dimensions are merely an example and may be determined depending on conditions such as a desired differential impedance, a required frequency band, and a dielectric constant of the dielectric layer 10.

Figure 6:
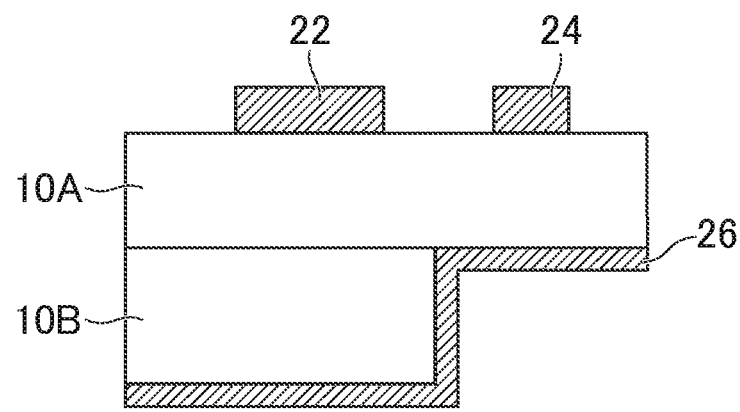
FIG. 6 is a cross-sectional view of an example differential circuit board described herein.

FIG. 6 is a cross-sectional view of an example differential circuit board. The example differential circuit board is different from the example differential circuit boards described herein in relation to FIGS. 1-5 in that the dielectric layer is a multilayer (e.g., layers 10A, 10B with different dielectric constants). What is described above in relation to FIGS. 1-5 is applicable hereto.

Figure 7:
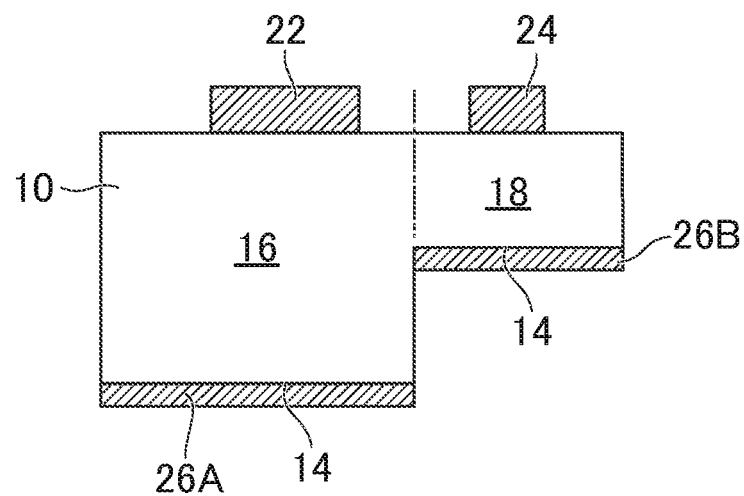
FIG. 7 is a cross-sectional view of an example differential circuit board described herein.

FIG. 7 is a cross-sectional view of an example differential circuit board. The example differential circuit board is different from the example differential circuit boards described herein in relation to FIGS. 1-6 in that the ground conductor is divided. The ground conductor includes a first ground conductor 26A on the second surface 14 of the first portion 16. The ground conductor includes a second ground conductor 26B disposed on the second surface 14 of the second portion 18 and separated from the first ground conductor 26A. The ground conductor 26 is not formed on the side surface, which is adjacent to the second portion 18, of the first portion 16. What is described above in relation to FIGS. 1-6 is applicable hereto.

Figure 8:
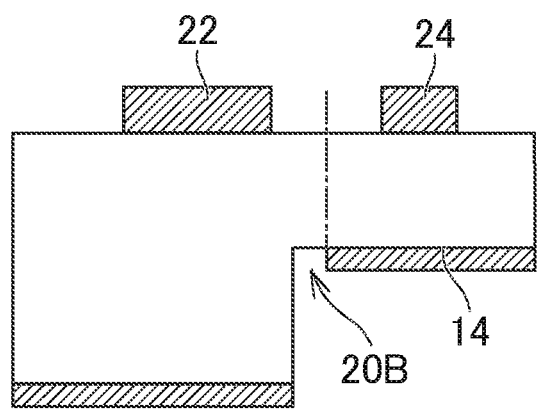
FIG. 8 is a cross-sectional view of an example differential circuit described herein.

FIG. 8 is a cross-sectional view of an example differential circuit board. The example differential circuit board is different from the example differential circuit boards described herein in relation to FIGS. 1-7 in that the step 20B of the second surface 14 is not just below the center of the space between the first conductor line 22 and the second conductor line 24. What is described above in relation to FIGS. 1-7 is applicable hereto.

Figure 9:
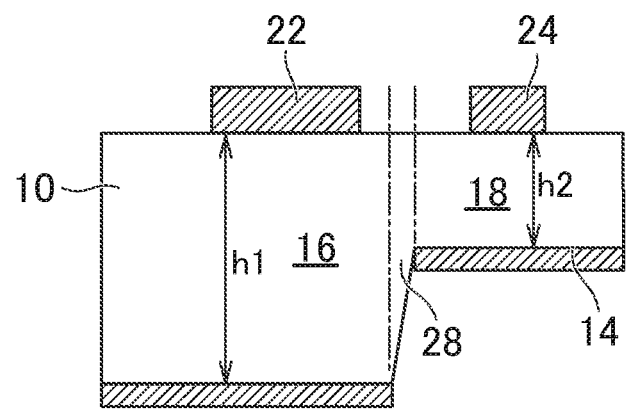
FIG. 9 is a cross-sectional view of an example differential circuit board described herein.

FIG. 9 is a cross-sectional view of an example differential circuit board. The dielectric layer 10 has a third portion 28, which varies in thickness, between the first portion 16 and the second portion 18. The third portion 28 overlaps with none of the first conductor line 22 and the second conductor line 24. The second conductor line 24 is located at a center of the second portion 18 in an aligning direction of the first conductor line 22 and the second conductor line 24. The third portion 28 is integrated with the first portion 16 in a first thickness h1 and integrated with the second portion 18 in a second thickness h2. The second surface 14 of the first portion 16 and the second surface 14 of the second portion 18 are connected with an inclined surface of the third portion 28. Such a shape is also free from a practically serious level difference in the high-frequency characteristics.

Figure 10:
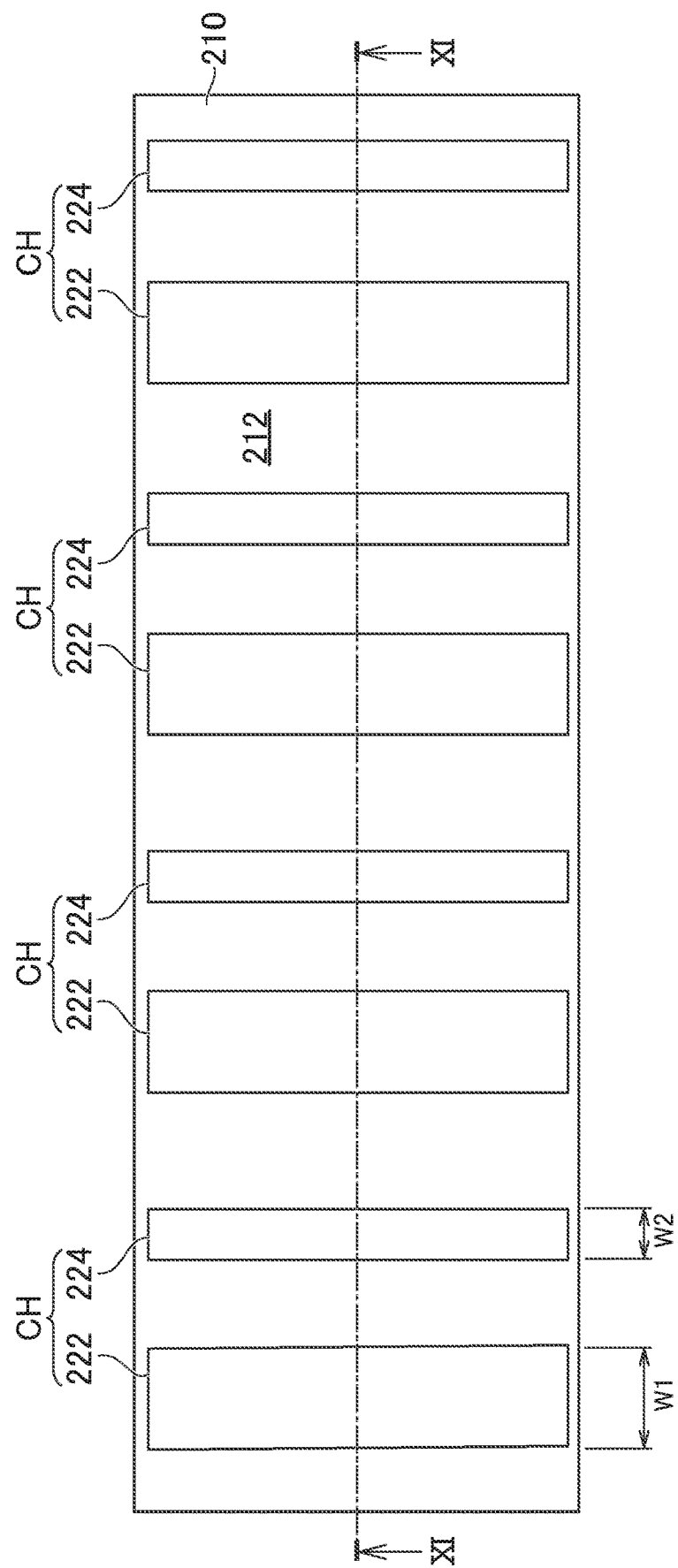
FIG. 10 is a plan view of an example differential circuit board described herein.
Figure 11:
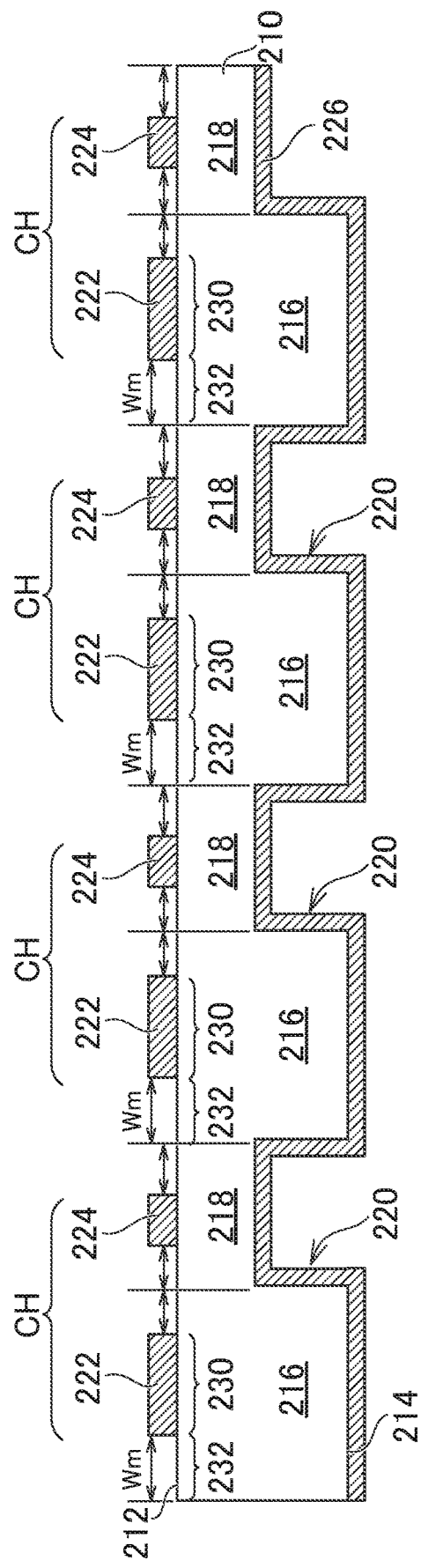
FIG. 11 is an XI-XI cross-sectional view of the example differential circuit board shown in FIG. 10.

FIG. 10 is a plan view of an example differential circuit board. FIG. 11 is an XI-XI cross-sectional view of the example differential circuit board shown in FIG. 10.

A dielectric layer 210 includes some first sections 216. The dielectric layer 210 includes some second portions 218. The first portions 216 and the second portions 218 are alternately arranged. A first conductor line 222 is disposed on a first surface 212 of each of the first portions 216. A second conductor line 224 is disposed on the first surface 212 of each of the second portions 218. The first conductor line 222 and the second conductor line 224 constitute differential transmission lines in each of multiple channels CH.

Each of the first portions 216, on the first surface 212, includes a routing area 230 in which the first conductor line 222 is formed. Each of the first portions 216, on the first surface 212, includes a margin area 232 adjacent to the routing area 230, with a margin width Wm in a direction against the second conductor line 224. The first portions 216 are equal in the margin width Wm.

A ground conductor 226 is continuous on a second surface 214 of the first portion 216 and on the second surface 214 of the second portion 218. The second surface 214 has a step 220 between the first portion 216 and the second portion 218. The step 220 of the second surface 214 is just below the center of the space between the first conductor line 222 and the second conductor line 224. The second conductor line 224 is located at the center of the second portion 218 in the alignment direction of the first conductor line 222 and the second conductor line 224. What is described above in relation to FIGS. 1-9 is applicable hereto.

In some implementations, a second line-width W2 is smaller than a first line-width W1 in each channel CH, providing a small array-type differential circuit board. Alternatively, the distance between the adjacent channels CH may increase without changing the size of the array-type differential circuit board. This enables reduction of crosstalk. Alternatively, the distance between the adjacent channels CH may be larger, with the differential circuit board smaller.

Figure 12:
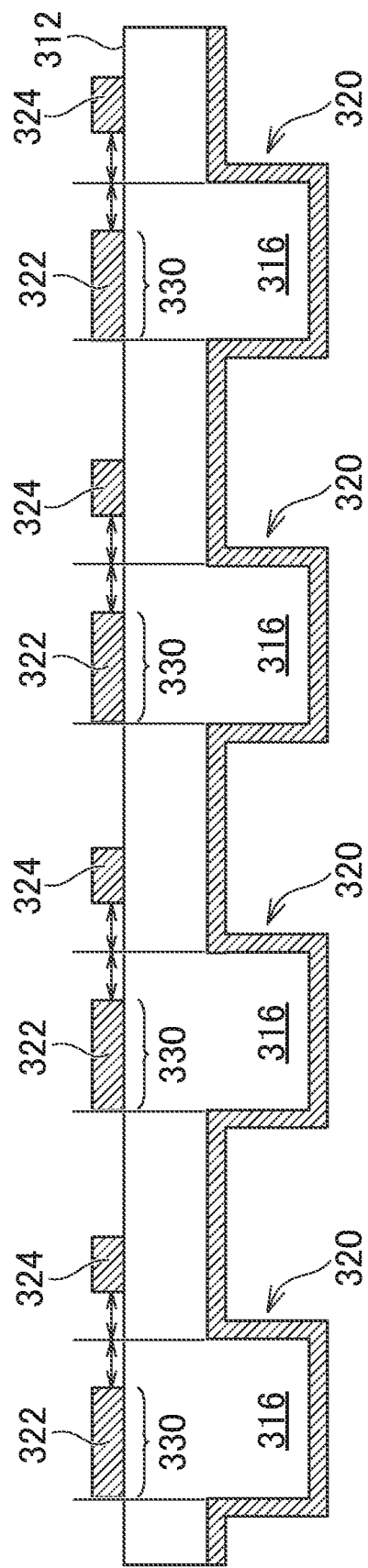
FIG. 12 is a cross-sectional view of an example differential circuit board described herein.

FIG. 12 is a cross-sectional view of an example differential circuit board. Each of first portions 316, on a first surface 312, has a routing area 330 in which a first conductor line 322 is formed. Each of the first portions 316, on the first surface 312, has no margin adjacent to the routing area 330 in the direction against a second conductor line 324. A step 320 of a second surface 314 is just below the center of the space between the first conductor line 322 and the second conductor line 324. What is described above in relation to FIGS. 10-11 is applicable hereto.

Figure 13:
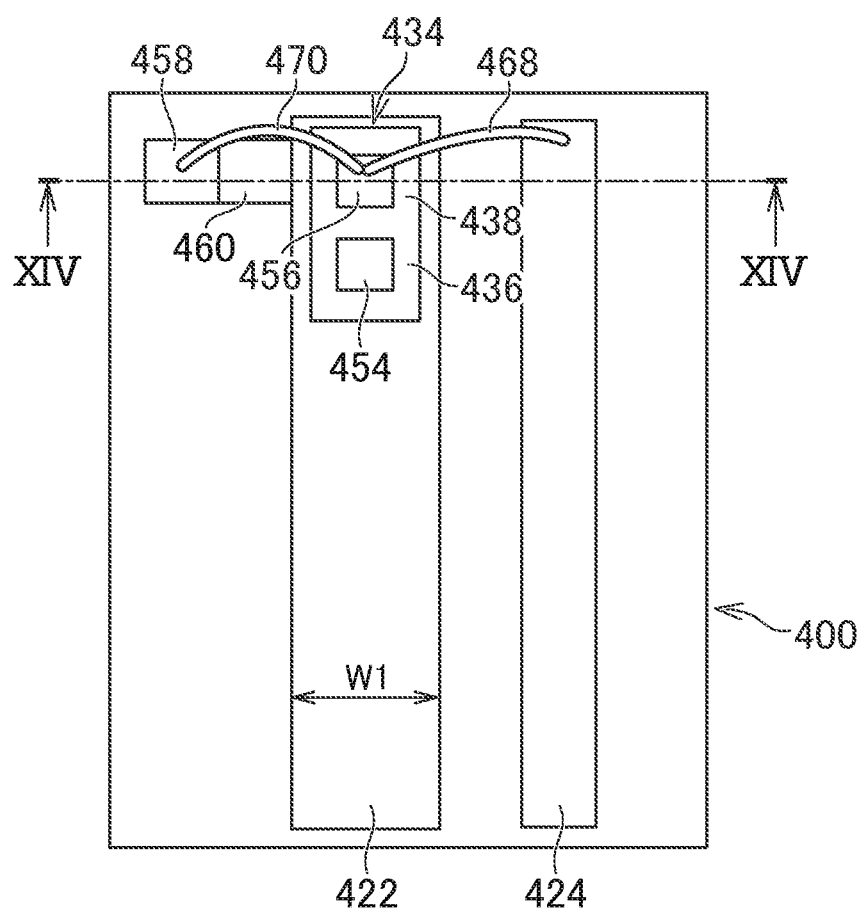
FIG. 13 is a plan view of an example semiconductor light-emitting device described herein.
Figure 14:
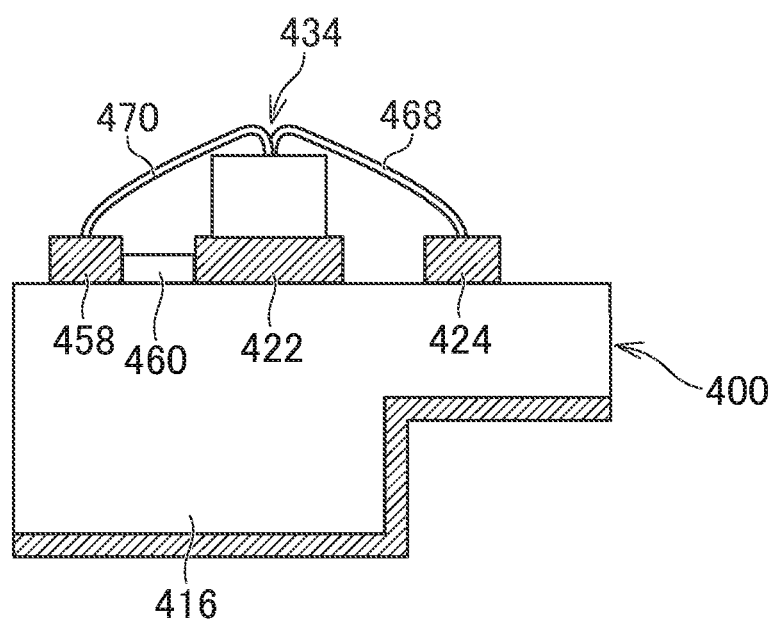
FIG. 14 is a XIV-XIV cross-sectional view of the example semiconductor light-emitting device shown in FIG. 13.

FIG. 13 is a plan view of an example semiconductor light-emitting device. FIG. 14 is a XIV-XIV cross-sectional view of the example semiconductor light-emitting device shown in FIG. 13. The semiconductor light-emitting device has a differential circuit board 400. What is described above in relation to FIGS. 1-9 is applicable to the differential circuit board 400.

An optical semiconductor device 434 is mounted on the differential circuit board 400. The optical semiconductor device 434 has a semiconductor laser 436 for emitting light. The optical semiconductor device 434 has an electro-absorption modulator 438 for modulating light by an electro-absorption effect. The optical semiconductor device 434 is an electro-absorption modulator integrated laser having the semiconductor laser 436 and the electro-absorption modulator 438 integrated therein.

Figure 15:
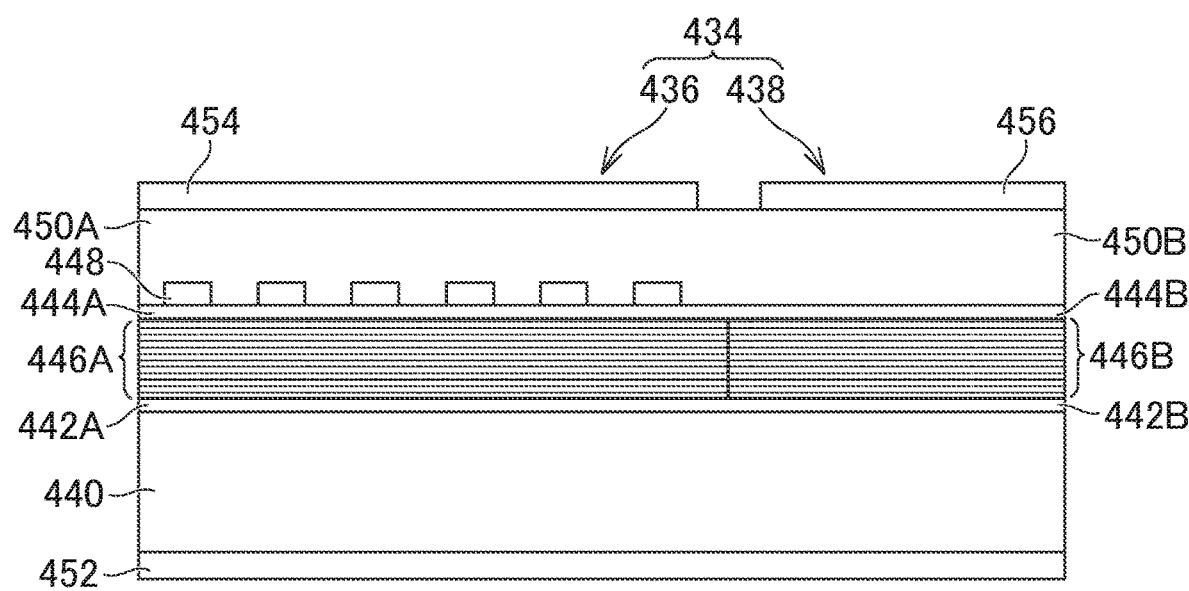
FIG. 15 is a cross-sectional view of an example optical semiconductor device described herein.

FIG. 15 is a cross-sectional view of an example optical semiconductor device 434 (e.g., of the example semiconductor light-emitting device described above in relation to FIGS. 13-14). The semiconductor laser 436 and the electro-absorption modulator 438 are built into a semiconductor substrate 440. The semiconductor substrate 440 is an n-type InP substrate. The semiconductor laser 436 has a multi-quantum well 446A interposed between a lower SCH (Separated Confinement Heterostructure) layer 442A and an upper SCH layer 444A, on the semiconductor substrate 440. There is a diffraction grating layer 448, on the upper SCH layer 444A, covered with a cladding layer 450A. The laser 436 may be in a distributed bragg reflector (DBR) configuration or a distributed feedback (DFB) configuration.

The electro-absorption modulator 438 has a multi-quantum well 446B interposed between a lower SCH layer 442B and an upper SCH layer 444B, above the semiconductor substrate 440. The upper SCH layer 444B is covered with a cladding layer 450B. The cladding layer 450A and the cladding layer 450B may be the same material or different materials. The electro-absorption modulator 438 and the semiconductor laser 436 may not be integrated on the same semiconductor substrate 440 but may be formed on different semiconductor substrates 440.

The optical semiconductor device 434 has a lower electrode 452 (e.g., a cathode), common to the electro-absorption modulator 438 and the semiconductor laser 436. The lower electrode 452 may be separately formed on each of the electro-absorption modulator 438 and the semiconductor laser 436. The semiconductor laser 436 has an upper electrode 454 (e.g., anode) for applying a direct current voltage. The direct current voltage is applied between the upper electrode 454 and the lower electrode 452. The optical semiconductor device 434 has an upper electrode 456 (e.g., anode) of the electro-absorption modulator 438. An AC voltage is applied between the upper electrode 456 and the lower electrode 452.

The optical semiconductor device 434 (lower electrode 452) is opposed to a first conductor line 422, without protrusion. A first line-width W1 (e.g., as shown in FIG. 13) of the first conductor line 422 is set to a size enough to mount the optical semiconductor device 434 and is constant in the extending direction. The upper electrode 456 of the electro-absorption modulator 438 is connected to a second conductor line 424 with a wire 468. Although not shown, the upper electrode 454 of the semiconductor laser 436 is electronically connected to the direct current source by a connection means such as a wire.

The differential circuit board 400 has a pad 458 disposed on a first surface 412 and adjacent to the first conductor line 422 in a direction against the second conductor line 424 (e.g., as shown in FIG. 14). A pad 458 is disposed on a first portion 416. The differential circuit board 400 has a matching resistor 460 connected in series between the pad 458 and the first conductor line 422. The matching resistor 460 is connected for impedance matching. The semiconductor light-emitting device has a wire 470 configured to connect the upper electrode 456 of the electro-absorption modulator 438 and the pad 458. Thus, the matching resistor 460 is connected in parallel to the electro-absorption modulator 438.

High-frequency signals for differential signal transmission are input to the first conductor line 422 and the second conductor line 424. The high frequency signals are applied to the lower electrode 452 and the upper electrode 456 of the electro-absorption modulator 438, respectively, for driving it by differential signals.

Figure 16:
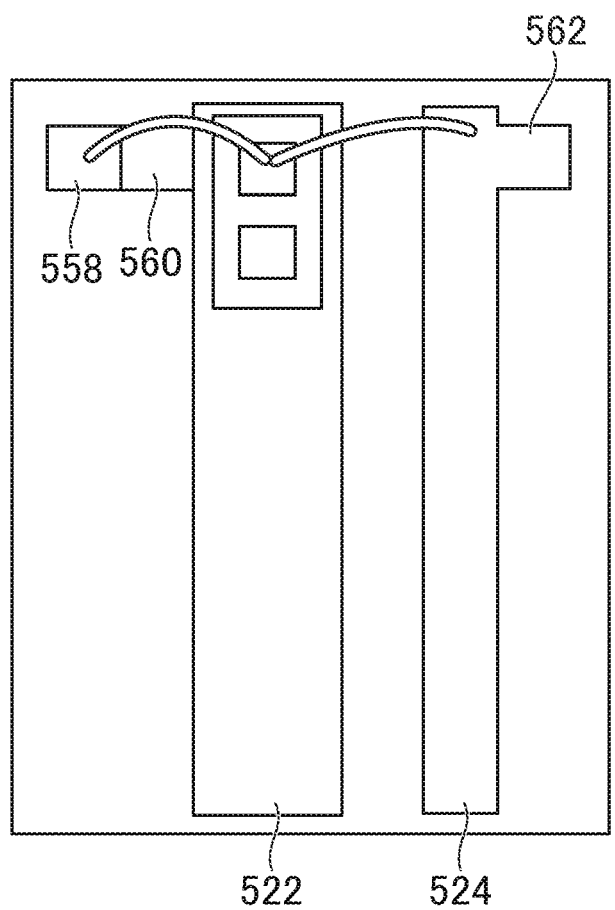
FIG. 16 is a plan view of an example semiconductor light-emitting device described herein.

FIG. 16 is a plan view of an example semiconductor light-emitting device. A second conductor line 524 has a stub 562 extending in a direction against a first conductor line 522. The stub 562 comprises a same material or same laminated materials as the second conductor line 524. The first conductor line 522 has a portion adjacent to the pad 558 and a portion, where the stub 562 extends, adjacent to the second conductor line 524.

The second conductor line 524 has the stub 562, thereby being closer in electrical characteristics to the first conductor line 522 connected to the matching resistor 560 and the pad 558. As a result, the high-frequency line of the first conductor line 522 and the second conductor line 524 become closer in high-frequency characteristics, improving the signal quality of a drive by differential signals. What is described above in relation to FIGS. 13-15 is applicable hereto.

Figure 17:
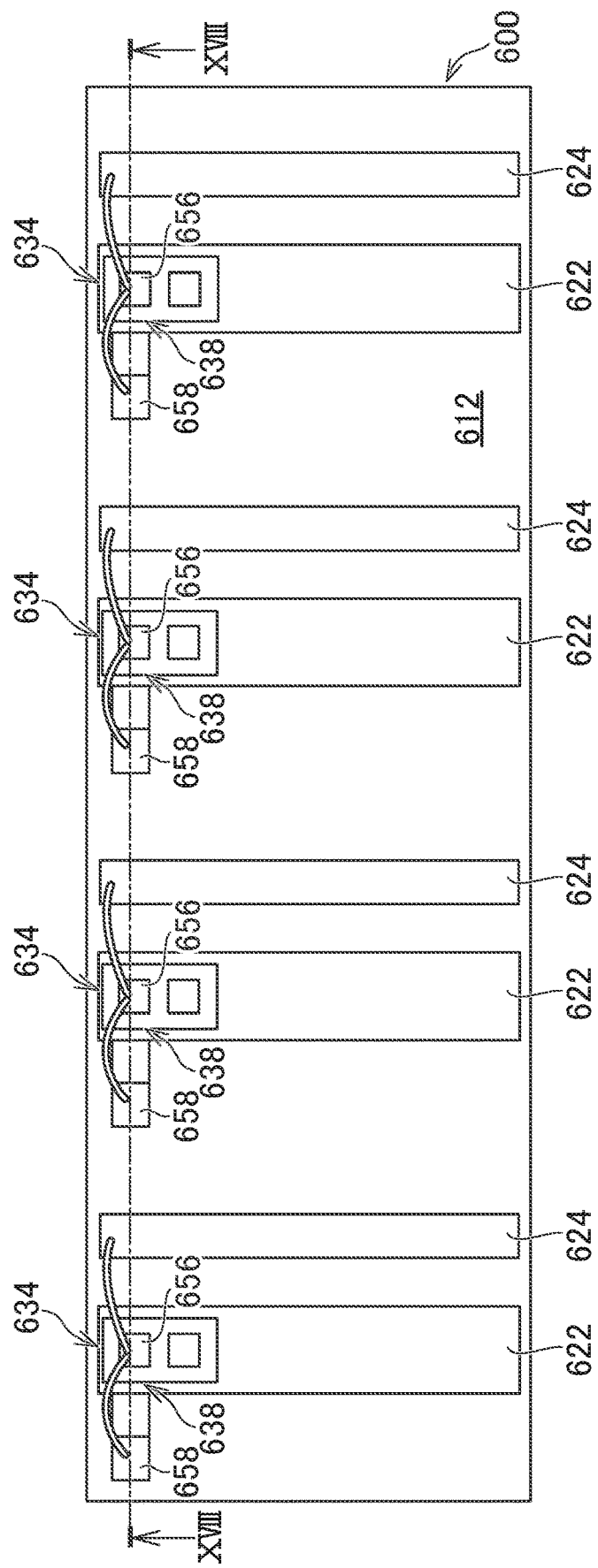
FIG. 17 is a plan view of an example semiconductor light-emitting device described herein.
Figure 18:
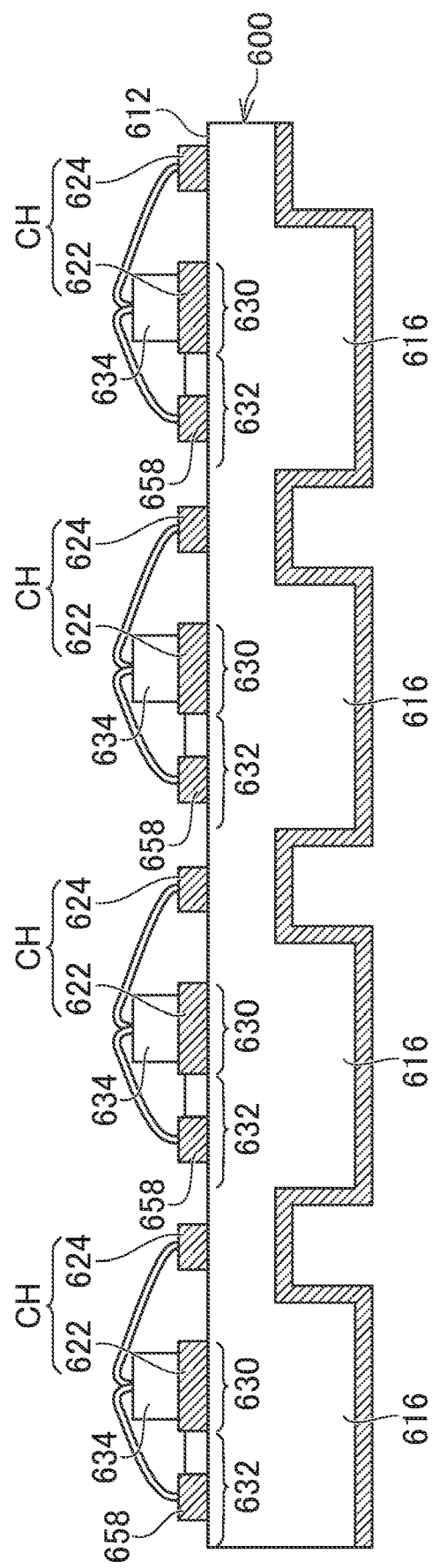
FIG. 18 is an XVIII-XVIII cross-sectional view of the example light-emitting device shown in FIG. 17.

FIG. 17 is a plan view of an example semiconductor light-emitting device. FIG. 18 is an XVIII-XVIII cross-sectional view of the example light-emitting device shown in FIG. 17.

The example semiconductor light-emitting device has a differential circuit board 600. What is described above in relation to FIG. 11 and FIG. 13 is applicable to the differential circuit board 600. The semiconductor example light-emitting device has an optical semiconductor device 634. What is described above in relation to FIG. 13 is applicable to the optical semiconductor device 634.

Each of first portions 616, on a first surface 612, includes a routing area 630 in which a first conductor line 622 is formed. Each of the first portions 616, on the first surface 612, includes a margin area 632 adjacent to the routing area 630 with a margin width Wm (e.g., as described above in relation to FIG. 11) in the direction against a second conductor line 624. The first portions 616 are equal in the margin width Wm. A pad 658 is disposed on the first portion 616.

In each channel CH, high-frequency signals for differential signal transmission are input to the first conductor line 622 and the second conductor line 624. The high frequency signals are applied to the lower electrode (not shown) and an upper electrode 656 of an electro-absorption modulator 638, respectively, for the drive by differential signals.

Figure 19:
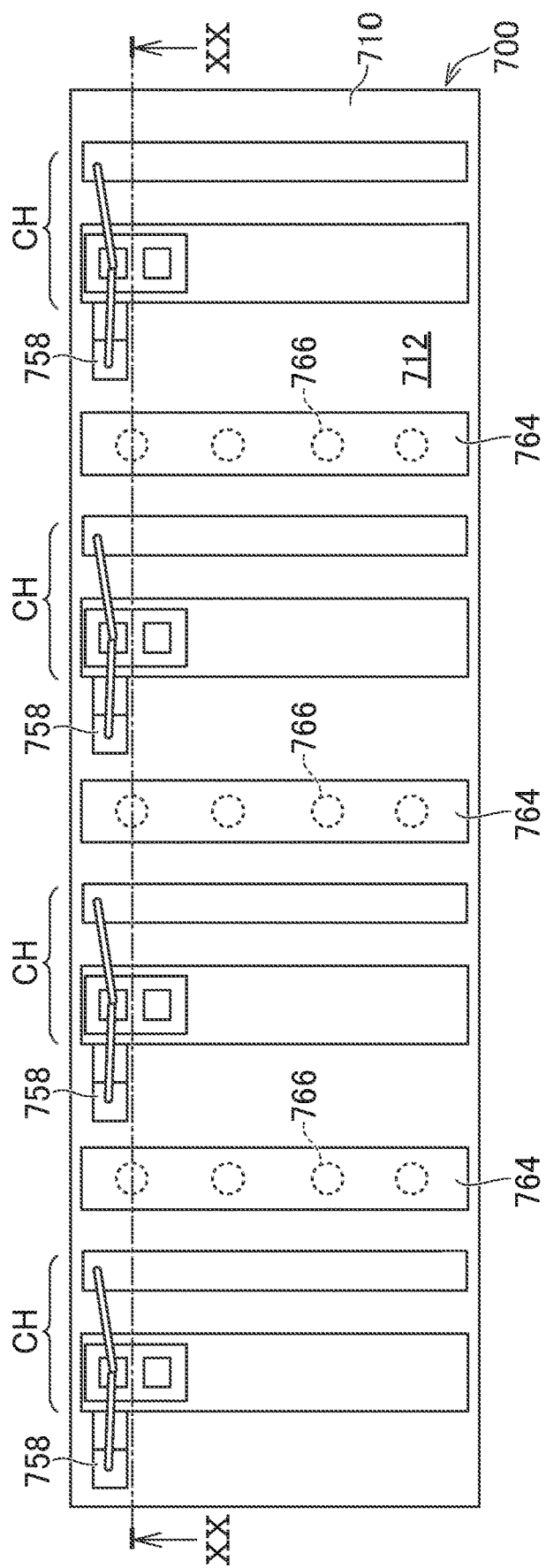
FIG. 19 is a plan view of an example semiconductor light-emitting device described herein.
Figure 20:
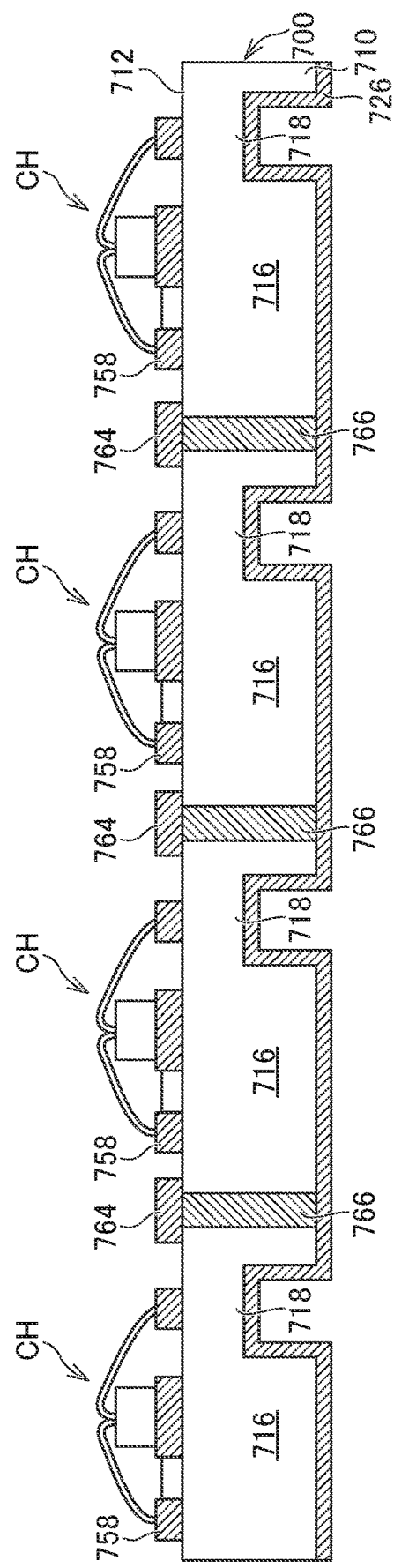
FIG. 20 is a XX-XX cross-sectional view of the example semiconductor light-emitting device shown in FIG. 19.

FIG. 19 is a plan view of an example semiconductor light-emitting device. FIG. 20 is a XX-XX cross-sectional view of the example semiconductor light-emitting device shown in FIG. 19.

A differential circuit board 700, between adjacent channels CH, has an inter-channel conductor 764 (e.g., a via, such as a filled via or a through-hole via) disposed on a first surface 712. The differential circuit board 700 has a connecting conductor 766 connecting a ground conductor 726 and the inter-channel conductor 764 and penetrating a dielectric layer 710. The connecting conductor 766 penetrates a first portion 716, without penetrating a second portion 718. A pad 758 is disposed on the first portion 716.

The inter-channel conductor 764 connected to the ground conductor 726 is disposed between the adjacent channels CH, thereby reducing the electrical crosstalk between the adjacent channels CH.

FIG. 21 is a cross-sectional view of an example semiconductor light-emitting device. A differential circuit board 800 has an inter-channel conductor 864 disposed on a first surface 812, between adjacent channels CH. The differential circuit board 800 penetrates a dielectric layer 810 and has a connecting conductor 866 connecting a ground conductor 826 and the inter-channel conductor 864. A connecting conductor 866 penetrates a second portion 818, without penetrating the first portion 816. A pad 858 is disposed on the second portion 818.

The inter-channel conductor 864 is formed on the thin second portion 818, making the through hole smaller. For example, small diameter vias can be formed. Therefore, a smaller semiconductor light-emitting device is provided.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A differential circuit board comprising:
a dielectric layer having a first surface and a second surface,
wherein the dielectric layer has a first portion with a first thickness between the first surface and the second surface and has a second portion with a second thickness less than the first thickness between the first surface and the second surface;
a first conductor line with a first line-width,
wherein the first conductor line is disposed on the first surface of the first portion;
a second conductor line with a second line-width less than the first line-width,
wherein the second conductor line is disposed on the first surface of the second portion; and
a ground conductor disposed on the second surface of the first portion and the second surface of the second portion, wherein the ground conductor overlaps with the first conductor line and the second conductor line,
wherein the first conductor line and the second conductor line are differential transmission lines.

2. The differential circuit board of claim 1, wherein the ground conductor is continuous on the second surface of the first portion and the second surface of the second portion.

3. The differential circuit board of claim 1, wherein:
the ground conductor includes a first ground conductor disposed on the second surface of the first portion; and
the ground conductor includes a second ground conductor disposed on the second surface of the second portion,
wherein the second ground conductor is separated from the first ground conductor.

4. The differential circuit board of claim 1, wherein the dielectric layer has a third portion with a varying thickness between the first portion and the second portion,
wherein the third portion overlaps with none of the first conductor line and the second conductor line.

5. The differential circuit board of claim 1, wherein the second surface has a level difference between the first portion and the second portion,
wherein the level difference is below a center of a space between the first conductor line and the second conductor line.

6. The differential circuit board of claim 1, wherein the second conductor line is positioned at a center of the second portion in an arranging direction of the first conductor line and the second conductor line.

7. The differential circuit board according to claim 1, wherein:
the dielectric layer includes a plurality of first portions, wherein the plurality of first portions comprises the first portion;
the dielectric layer includes a plurality of second portions, wherein the plurality of second portions comprises the second portion;
the first conductor line is disposed on the first surface of each of the plurality of first portions;
the second conductor line is disposed on the first surface of each of the plurality of second portions; and
the first conductor line and the second conductor line are respective differential transmission lines in multiple channels.

8. The differential circuit board of claim 7, wherein:
each of the plurality of first portions, on the first surface, includes a routing area in which the first conductor line is formed and includes a margin area adjacent to the routing area in a direction against the second conductor line,
wherein the margin area has a margin width, and
wherein each of the plurality of first portions has a width that is equal to the margin width.

9. The differential circuit board of claim 7, wherein each of the plurality of first portions, on the first surface, includes a routing area in which the first conductor line is formed and includes no margin area adjacent to the routing area in a direction against the second conductor line.

10. The differential circuit board of claim 7, further comprising:
an inter-channel conductor on the first surface and between adjacent channels of the multiple channels; and
a connecting conductor configured to penetrate the dielectric layer and connect the ground conductor and the inter-channel conductor.

11. The differential circuit board of claim 10, wherein the connecting conductor is configured to penetrate the first portion without penetrating the second portion.

12. The differential circuit board of claim 10, wherein the connecting conductor is configured to penetrate the second portion without penetrating the first portion.

13. A semiconductor light-emitting device comprising:
a differential circuit board; and
an optical semiconductor device mounted on the differential circuit board, wherein:
the differential circuit board comprises:
a dielectric layer having a first surface and a second surface,
wherein the dielectric layer has a first portion with a first thickness between the first surface and the second surface and has a second portion with a second thickness less than the first thickness between the first surface and the second surface;
a first conductor line with a first line-width,
wherein the first conductor line is disposed on the first surface of the first portion;
a second conductor line with a second line-width less than the first line-width,
wherein the second conductor line is disposed on the first surface of the second portion; and
a ground conductor disposed on the second surface of the first portion and the second surface of the second portion,
wherein the ground conductor overlaps with the first conductor line and the second conductor line,
wherein the first conductor line and the second conductor line are differential transmission lines.

14. The semiconductor light-emitting device of claim 13, wherein:
the optical semiconductor device is an electro-absorption modulator integrated laser in which an electro-absorption modulator and a semiconductor laser are integrated;
the electro-absorption modulator integrated laser includes a lower electrode common to the electro-absorption modulator and the semiconductor laser, and includes an upper electrode of the electro-absorption modulator;
the lower electrode is opposite to the first conductor line without protrusion; and
the upper electrode is connected to the second conductor line with a wire.

15. The semiconductor light-emitting device of claim 14, further comprising:
a pad on the first surface, the pad being adjacent to the first conductor line in a direction against the second conductor line;
a matching resistor connected in series between the pad and the first conductor line; and
a wire configured to connect the upper electrode and the pad.

16. The semiconductor light-emitting device of claim 15, wherein the pad is on the first portion.

17. The semiconductor light-emitting device of claim 15, wherein the pad is on the second portion.

18. The semiconductor light-emitting device of claim 15, wherein:
the second conductor line has a stub extending in a direction against the first conductor line, and
the first conductor line has a portion adjacent to the pad and adjacent to part, where the stub extends, of the second conductor line.

19. The semiconductor light-emitting device of claim 14, wherein the second surface has a level difference between the first portion and the second portion,
   wherein the level difference is below a center of a space between the first conductor line and the second conductor line.

20. The semiconductor light-emitting device of claim 14, wherein the second conductor line is positioned at a center of the second portion in an arranging direction of the first conductor line and the second conductor line.

* * * * *

UNITED STATES PATENT AND TRADEMARK OFFICE
CERTIFICATE OF CORRECTION

| | | |
|---|---|---|
| PATENT NO. | : 12,082,336 B2 | Page 1 of 1 |
| APPLICATION NO. | : 17/216118 | |
| DATED | : September 3, 2024 | |
| INVENTOR(S) | : Koichiro Adachi | |

It is certified that error appears in the above-identified patent and that said Letters Patent is hereby corrected as shown below:

On the Title Page

Item (54) and in the Specification Column 1, Lines 1-3, The title "DIFFERENTIAL CIRCUIT BOARD AND SEMICONDUCTOR LIGHT EMITTING DEVICE" should be changed to
--DIFFERENTIAL CIRCUIT BOARD AND SEMICONDUCTOR LIGHT-EMITTING DEVICE--.

Signed and Sealed this
Fifteenth Day of October, 2024

Katherine Kelly Vidal
*Director of the United States Patent and Trademark Office*